United States Patent [19]

Ushikawa

[11] Patent Number: 5,116,784

[45] Date of Patent: May 26, 1992

[54] METHOD OF FORMING SEMICONDUCTOR FILM

[75] Inventor: Harunori Ushikawa, Kofu, Japan

[73] Assignee: Tokyo Electron Limited, Tokyo, Japan

[21] Appl. No.: 773,430

[22] Filed: Oct. 9, 1991

[30] Foreign Application Priority Data

Nov. 30, 1990 [JP] Japan .................................. 2-340199

[51] Int. Cl.⁵ .................... H01L 21/00; H01L 21/02; H01L 21/31; C23C 16/00
[52] U.S. Cl. .................................... 437/225; 437/228; 437/233; 148/DIG. 30; 148/DIG. 35; 118/50; 118/715; 427/69; 427/70; 427/248.1
[58] Field of Search ............... 437/225, 228, 233, 235, 437/240; 148/DIG. 30, DIG. 35, DIG. 42; 118/50, 715, 724; 427/69, 70, 248.1

[56] References Cited

U.S. PATENT DOCUMENTS

| | | | |
|---|---|---|---|
| 3,925,118 | 12/1975 | Hollan | 437/110 |
| 3,949,119 | 4/1976 | Shewchun et al. | 437/106 |
| 3,956,037 | 5/1976 | Ishii et al. | 437/112 |
| 4,190,470 | 2/1980 | Walline | 427/8 |
| 4,217,375 | 8/1980 | Adams | 437/236 |
| 4,378,259 | 3/1983 | Hasegawa | 437/110 |
| 4,659,401 | 4/1987 | Reif et al. | 427/39 |
| 4,698,104 | 10/1987 | Barker et al. | 437/141 |
| 4,699,805 | 10/1987 | Seelbach et al. | 437/245 |
| 4,773,355 | 9/1988 | Reif et al. | 118/719 |
| 4,968,644 | 11/1990 | Gallagher et al. | 437/192 |

FOREIGN PATENT DOCUMENTS 0075219 6/1980 Japan .
0132331 8/1982 Japan .
0078814 4/1987 Japan .

Primary Examiner—Brian E. Hearn
Assistant Examiner—B. Everhart
Attorney, Agent, or Firm—Oblon, Spivak, McClelland, Maier & Neustadt

[57] ABSTRACT

$Si_2H_6$ and $PH_3$ are introduced into a heated reaction tube in which a plurality of substrates are contained under vacuum pressure, thereby forming phosphor-doped silicon films on the substrates. By changing the flow of $Si_2H_6$, a first layer consisting of a silicon film containing phosphor of low density, a second layer substantially consisting of phosphor, and a third layer consisting of substantially the same composition as that of the first layer are deposited in the order mentioned. Thereafter, the first through third layers are heated, thereby diffusing phosphor contained in the second layer. Thus, an integral film of uniform impurity density is formed from the first through third layers.

12 Claims, 4 Drawing Sheets

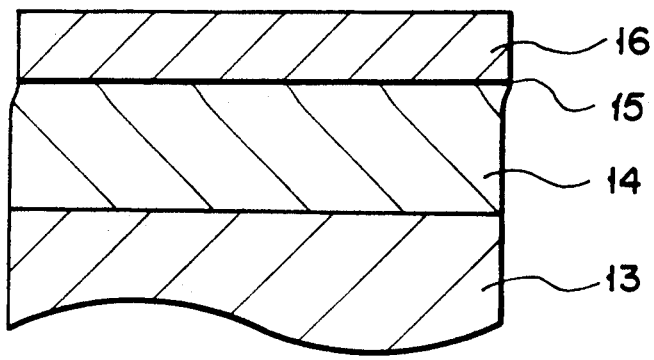
F I G. 3
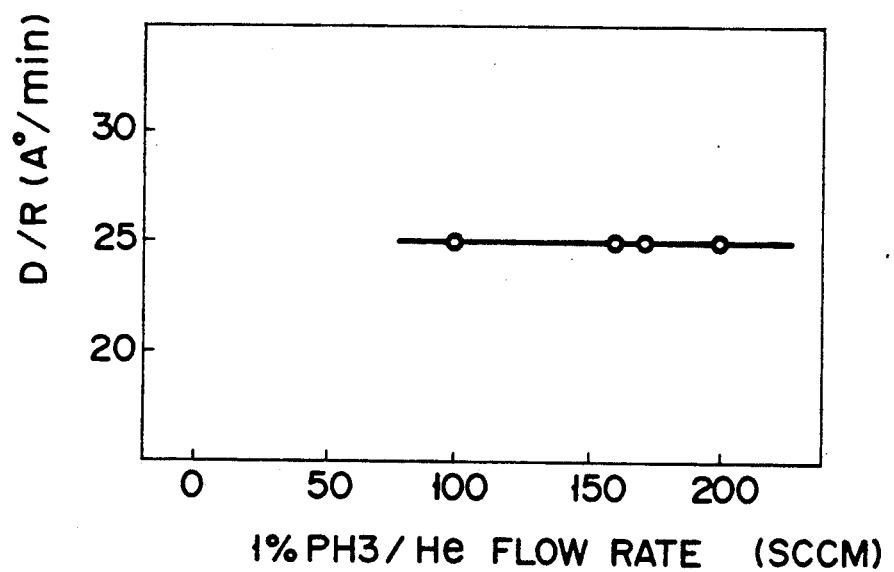
F I G. 4

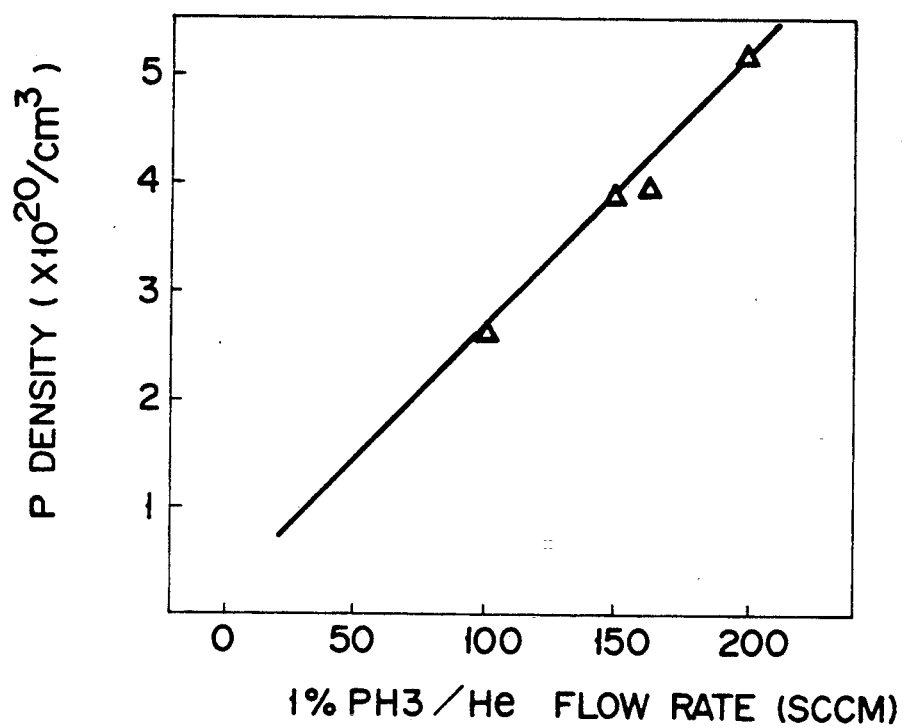
F I G. 5

METHOD OF FORMING SEMICONDUCTOR FILM

BACKGROUND OF THE INVENTION

1. Field of the Invention

This invention relates to a method of forming a semiconductor film.

2. Description of the Related Art

Many phosphor-doped polysilicon films are used as a wiring material for semiconductor devices.

Published Unexamined Japanese Patent Application No. 2-34917 discloses a method of forming a low density phosphor-doped polysilicon film on a semiconductor wafer by the use of LPCVD. Further, Published Unexamined Japanese Patent Application No. 2-81432 discloses a technique of forming a film on a semiconductor wafer using LPCVD and organic materials.

The LPCVD is a method of supplying a reaction gas into a reaction tube while reducing pressure in the tube by exhausting air therefrom, thereby forming a film. This method is advantageous to form the above-polysilicon film, since an impurity concentration, a phosphor (P) concentration in this case, is controlled by adjusting the flow of a gas containing P to be doped.

FIG. 4 shows a relationship between the flow of dope gas and the growing rate of a film, under the condition that the pressure in the reaction tube of an LPCVD apparatus is fixed. The abscissa indicates the flow of a mixture of 99% He gas and 1% phosphine gas, while the ordinate indicates the growing rate of a film. FIG. 5 shows a relationship between the flow of dope gas and the density of phosphor contained in a thin film, under the same condition as above. The abscissa indicates the flow of the same mixture as above, while the ordinate indicates the density of phosphor. Each of the values in these graphs is a mean value of values obtained in given 25 points of the wafer surface. As is evident from the graphs, in the LPCVD method using $Si_2H_6$, the density of the impurity can be controlled without changing the growing rate of a film, by adjusting the flow of the gas.

Apart from the above, to meet the recent demand for high integration and high reliability of a semiconductor device, the density of phosphor contained in a polysilicon film formed on the wafer must be uniform all over the film, the thickness of the film must be uniform, and films must be formed uniform between a plurality of wafers. In the LPCVD method, pressure in a reaction tube must be set at 0.05–0.3 Torr during growing films in order to enhance the uniformity of phosphor distribution.

Further, in a case where a phosphor-doped polysilicon film is formed using disilane serving as film forming gas and phosphine serving as dope gas, it is desirable to set the density of phosphine to about 1% in consideration of safety. Thus, if the required density of phosphor to be doped is high, a great amount of gas must be supplied. In this case, exhaustion efficiency must be greatly enhanced since the pressure in the reaction tube need be set at 0.05–0.3 Torr in a state where a great amount of gas is supplied therein.

However, the exhaustion efficiency has an upper limit for the following reasons:

In a vertical type CVD apparatus, for example, its housing for enclosing a reaction tube, and a mechanism for loading and unloading wafers, etc. is located between a clean room in which wafer cassettes are housed and a maintenance room in which a power control unit and a vacuum pump are installed. If the vacuum pump is arranged in the vicinity of the housing, it will be difficult to perform maintenance on the CVD apparatus, and further the vibration of the pump is transferred to wafers placed in the reaction tube, which raise dust. The dust may stick to the wafers and hence reduce the yield of products, so the pump must be located remote from the housing. Thus, an exhausting pipe extending between the vacuum pump and reaction tube inevitably has a low conductance, which requires a large capacity vacuum pump so as to provide high exhaustion efficiency. Moreover, a large diameter exhaustion pipe is required, resulting in an apparatus of a large size and a high cost.

SUMMARY OF THE INVENTION

It is the object of the invention to provide a semiconductor film-forming method which enables an apparatus having a small exhaustion efficiency to form, under vacuum pressure, an impurity-doped thin film having a predetermined impurity density in a state where the impurity is uniformly distributed over the entire surface of the film.

In the invention, there is provided a method of forming a semiconductor film on a substrate, comprising the steps of:

preparing a first treatment gas, the first treatment gas providing a main material of the semiconductor film as a result of thermal decomposition;

preparing a second treatment gas, the second treatment gas providing an impurity, with which the semiconductor film is doped, as a result of thermal decomposition;

heating a reaction tube;

loading the substrate into the reaction tube;

reducing pressure in the reaction tube;

supplying the reaction tube with the first and second treatment gases at first and second flow rates, respectively, thereby forming first layer on the substrate, the first layer containing the impurity of a first density;

supplying the reaction tube with the first and second treatment gases at third and fourth flow rates, respectively, thereby forming second layer on the first layer, the second layer containing the impurity of a second density sufficiently higher than the first density;

supplying the reaction tube with the first and second treatment gases at fifth and sixth flow rates, respectively, thereby forming third layer on the second layer, the third layer containing the impurity of a third density sufficiently lower than the second density; and diffusing the impurity contained in the second layer into the first and third layers by heating the first through third layers, thereby making an integral film of uniform impurity density form the first through third layers.

For example, a first layer of low impurity density is formed on a substrate from a film-forming gas and dope gas, then a second layer of high impurity density is formed on the first layer only from the dope gas (i.e., the supply of the film-forming gas is stopped), and further a third layer of low impurity density is formed on the second layer from the film-forming gas and dope gas (i.e, the supply of the film-forming gas is resumed). The resultant thin film is annealed, thereby diffusing the impurity contained in the second layer of high impurity density, into the first and third layers of low impurity density.

The invention can provide a thin film of desired impurity density and of uniform impurity distribution even by using a reaction tube having not so high exhaustion efficiency, and accordingly, can provide a thin film of high impurity density and of uniform impurity distribution without improving the exhaustion efficiency of the conventional reaction tube.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

FIG. 3 is a view useful in explaining a thin film produced by the apparatus using method of the invention;

FIG. 4 is a graph showing the relationship between the flow of $PH_3$ and the growing rate of the thin film; and FIG. 5 is a graph showing the relationship between the flow of $PH_3$ and the density of phosphor.

DETAILED DESCRIPTION OF THE PREFERRED EMBODIMENTS

Figure 1:
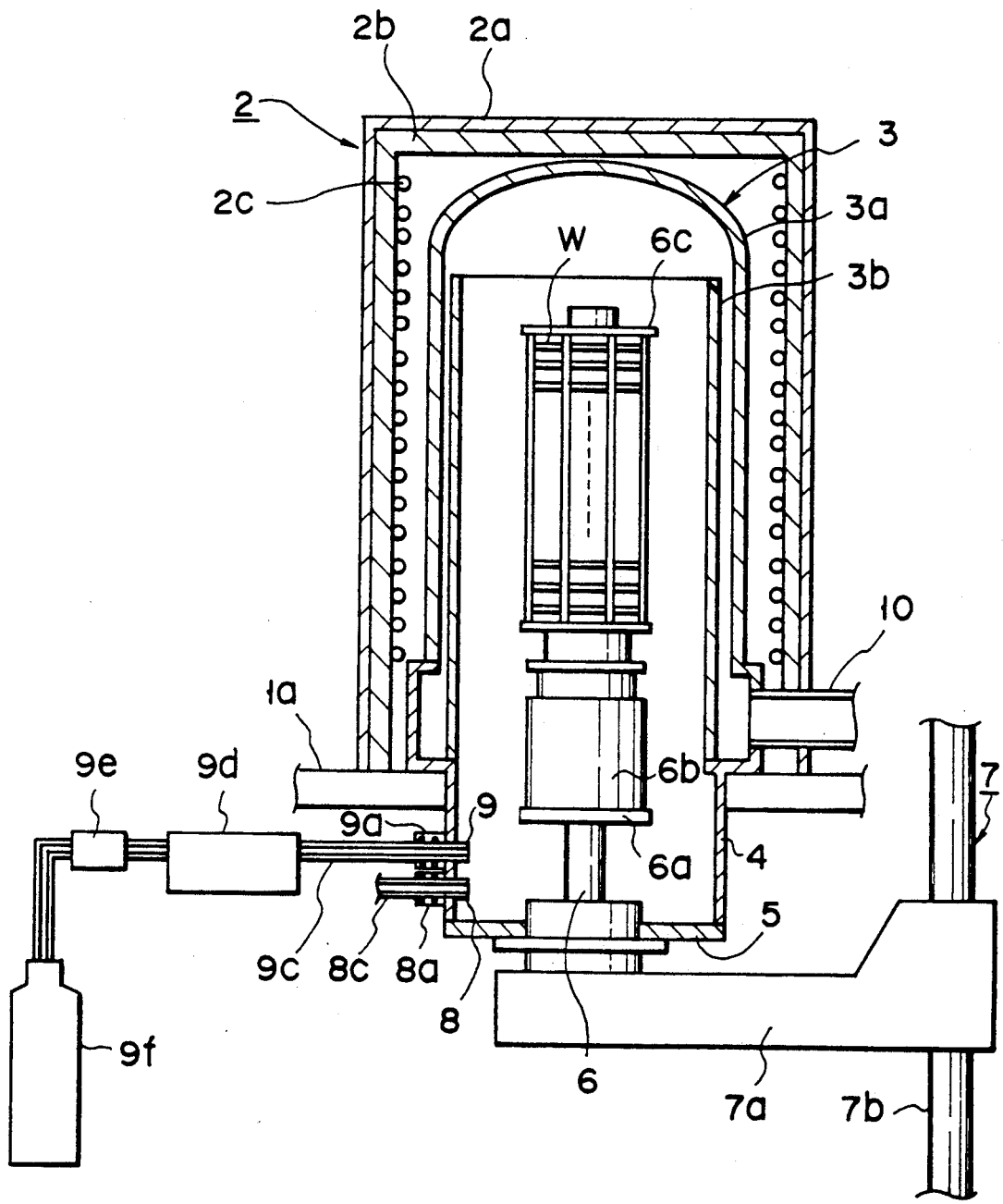
FIG. 1 is a partial view of a film-forming apparatus to which the method of the invention is applied.
Figure 2:
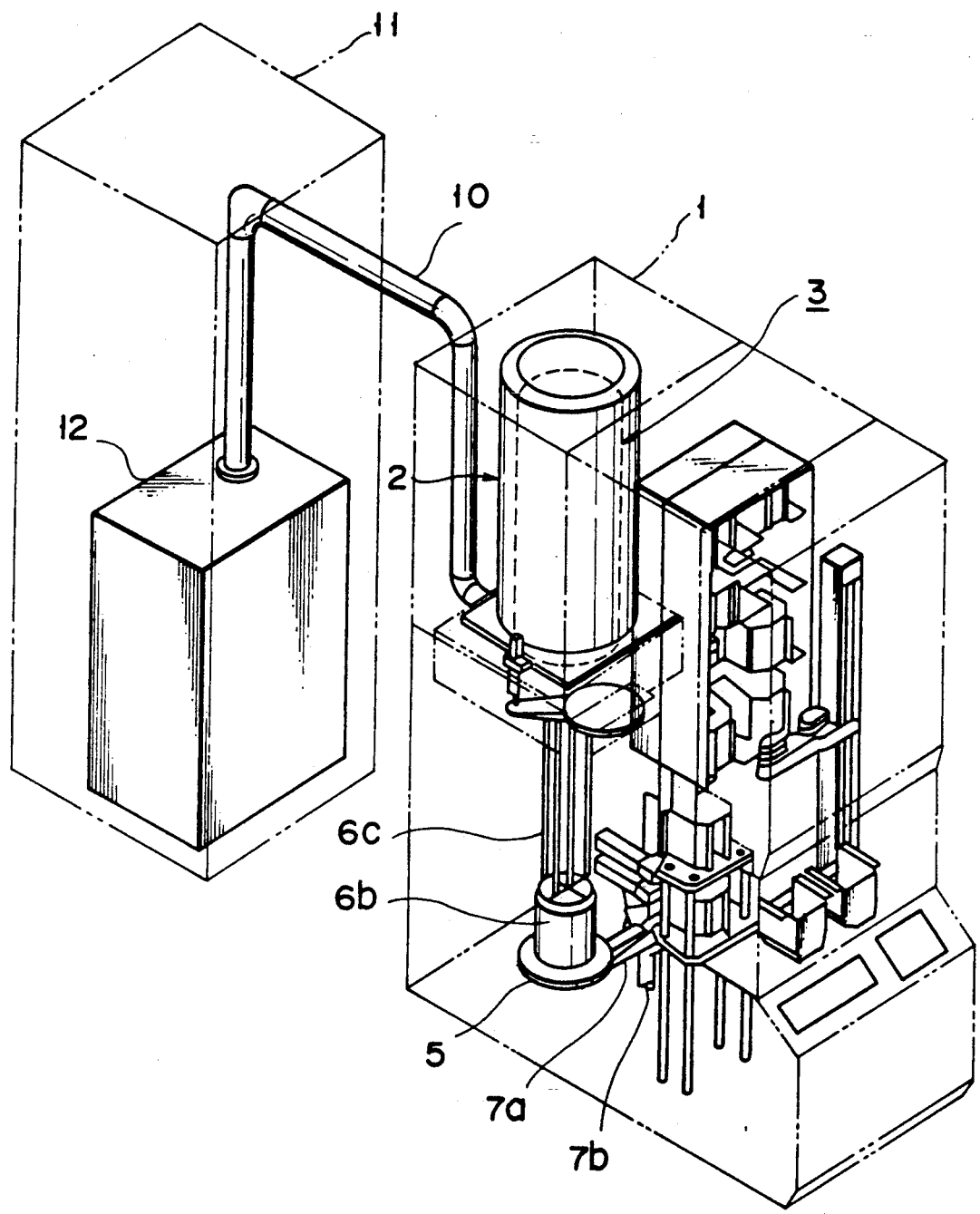
FIG. 2 is a perspective view of the apparatus, part of which is shown in FIG. 1, and which includes an exhaustion unit.

A film-forming apparatus to which the method of the invention is applied will be explained with reference to FIGS. 1 and 2.

The film-forming apparatus shown in the figures is a vertical type LPCVD apparatus enclosed in a housing 1 (shown in FIG. 2) located between a clean room and a maintenance room.

In an upper portion of the housing 1, a cylindrical furnace 2 is vertically located on a base plate 1a supported by the housing 1. The furnace 2 comprises a metal casing 2a, a heat insulation layer 2b coated on the entire inner surface of the metal casing 2a, and a cylindrical heater 2c consisting of e.g. a heating resistor, arranged on the inner surface of the heat insulation layer 2b, and surrounding a reaction tube, hereinafter referred to.

A cylindrical reaction tube 3 is vertically arranged in the furnace 2, and has a double-tube structure comprising an outer tube 3a made of a heat resistive material such as quartz and having an upper closed end and a lower opening end, and an inner tube 3b made of e.g. quartz and having upper and lower opening ends.

The outer and inner tubes 3a and 3b are supported by a cylindrical manifold 4 made of stainless steel at their respective lower ends. The manifold 4 is inserted in an opening formed in the base plate 1a and secured thereto. The manifold 4 has a lower opening in which a disk-like cap 5 made of stainless steel is removably fitted with an elastic O-ring (not shown) interposed. The cap 5 and O-ring cooperates to seal the manifold 4 in a hermetic manner.

A rotary shaft 6 is inserted through a substantial center portion of the cap 5, and can rotate in a hermetic manner utilizing e.g. magnetic sealing. The shaft 6 has a lower end connected to a rotary mechanism (not shown) coupled to an elevator 7a, and an upper end secured to a turn table 6a made of stainless steel.

A heat insulation cylinder 6b made of quartz is located on the turn table 6a in the inner tube 3b, with a predetermined interval therefrom, and has such a height that wafers may be placed in a uniformly heated area. A wafer boat 6c made of e.g. quartz is placed on the upper surface of the heat insulation cylinder 6b. The boat 6c can contain a plurality of semiconductor wafers, e.g. 50 wafers, stacked above one another with a predetermined space (e.g. 13mm) therebetween.

The elevator 7a forms a transfer mechanism 7 together with an elevator shaft 7b inserted in a base end of the elevator 7a for loading wafers and unloading treated wafers. That is, the transfer mechanism 7 cooperates the heat insulation cylinder 6b, turn table 6a, and cap 5 to load the wafer boat 6c into the reaction tube 3 and unload the boat therefrom.

A first gas guide pipe 8 made of e.g. quartz is horizontally inserted into the reaction tube 3 through a lower portion of a side wall of the manifold 4. A sealing member 8a is provided at the portion of the pipe 8, for preventing leakage of gas. The guide pipe 8 is also connected to a gas pipe 8c made of e.g. stainless steel The gas pipe 8c is connected to a gas supply source (not shown) for supplying a film-forming gas such as disilane ($Si_2H_6$) and a carrier gas such as nitrogen ($N_2$).

Further, there is provided a second gas guide pipe 9 made of e.g. quartz, on an upper side of the first gas guiding pipe 8. The pipe 9 is inserted through a lower side portion of the manifold 4 in a hermetic manner by means of a sealing member 9a. The second pipe 9 introduces into the reaction pipe 3 an organic compound gas, e.g. phosphine ($PH_3$) containing phosphor (P) as a dope element or another organic compound gas containing another dope element, such as boron (B) or arsenic (As). If necessary, the wafer boat 6c and hence wafers contained therein can be rotated, thereby further enhancing the uniformity of films formed on the wafers.

The second gas guide pipe 9 has the other end connected to an end of a gas pipe 9c made of e.g. stainless steel. The other end of the pipe 9c is connected to a gas supply source 9f filled with $PH_3$, via a gas heating unit 9d and a gas flow adjuster 9e. The gas heating unit 9d heats $PH_3$ to a predetermined temperature before the gas is supplied into the reaction tube 3. Thus, the unit 9d serves as a preactivating mechanism for activating the gas before it is supplied into the reaction tube.

An exhaustion pipe 10 made of e.g. stainless steel and having a diameter of 2 inches is connected to that upper portion of the manifold 4 which is above the base plate 1a, for setting pressure in the reaction tube 3 to a predetermined vacuum pressure by exhausting the treatment gases existing between the inner and outer tubes 3b and 3a. The exhaustion pipe 10 extends in an upper portion of the maintenance room, and is connected at the other end thereof to an exhaustion unit 12 consisting of a vacuum pump such as a dry pump and contained in another housing 11 (shown in FIG. 2) arranged remote from the housing 1 in the maintenance room. That is, the pipe 10 must cover a circuitous route from the housing 1 to the housing 11 in the upper portion of the maintenance room in view of maintenance of the apparatus. Thus, the length of the pipe is as much as about 3m.

The method of the invention to be applied to the above-described apparatus will be explained.

EXAMPLE

The treating area of the reaction tube 3 was heated up to 500° C. by means of the heater 2c, and then the wafer boat 6c containing 50 wafers W stacked with 13mm spaced from one another was loaded into the tube 3 from the lower opening of the tube by the transfer mechanism 7.

Then, the pressure in the reaction tube 3 was reduced to a predetermined vacuum pressure of e.g. $1 \times 10^{-3}$ Torr by exhausting air therein, and $Si_2H_6$, serving as film-forming gas containing the main component of a thin film, and $N_2$, serving as its carrier gas, were introduced into the inner tube 3b through the first gas guide pipe 8 at a flow rate of 100 SCCM, respectively. Simultaneously, a mixture of 1% $PH_3$, serving as dope gas, and 99% He, serving as its carrier gas, was heated up to 400° C. by the gas heating unit 9d, and then uniformly supplied onto the semiconductor wafers W at a flow rate of 100 SCCM through the second gas guide pipe 9. Under these conditions, films were grown on the wafers for 100 minutes in the reaction tube 3 in which exhaustion was performed so as to keep the pressure therein at 0.2 Torr.

Subsequently, to reduce the flow of the film-forming gas and its carrier gas, the supply of $Si_2H_6$ and $N_2$ was stopped (alternatively, it may be reduced) in a state where the flow of the mixture containing $PH_3$ was maintained as it had been. This state was kept for 15 minutes.

Thereafter, the supply of $Si_2H_6$ and $N_2$ was resumed at the same flow rate as above. This state was kept for 20 minutes. The pressure in the reaction tube 3 was kept at about 0.2 Torr at all times. Thus, the flow of the film-forming gas and its carrier gas was changed with the lapse of time.

As a result of the above treatment, as is shown in FIG. 3, a polysilicon film 14 containing phosphor of low density and having a thickness of 2500Å, a phosphor highly densified layer 15 (this layer consists substantially only of phosphor in the embodiment), and a polysilicon film 16 containing phosphor of the same density as that of the film 14 and having a thickness of 500Å were deposited on a $SiO_2$ film 13 of the wafer W subjected to the treatment, in the order mentioned.

Then, the resultant structure was subjected to 20-minute heat treatment in an annealing oven at a temperature of 900° C., whereby phosphor contained in the intermediate layer 15 was diffused into the lower and upper layers 14 and 16, resulting in a high density phosphor-doped polysilicon film of a thickness of 3000Å.

Although the flow of the film-forming gas has different values in predetermined time periods, it may be serially changed. A desired phosphor density film can be obtained by changing phosphor density-varying cycle.

The resultant high density phosphor-doped polysilicon film obtained by the method of the invention had a phosphor density of $2.4 \times 10^{20}/cm^3$, and a resistance of 20Ω.

COMPARATIVE EXAMPLE

To compare the method of the invention with a conventional method, a high density phosphor-doped polysilicon film having a thickness of 3000Å was formed, by means of the same LPCVD apparatus as that used in the embodiment, under the condition that the flows of $Si_2H_6$, $N_2$, and a mixture of 1% $PH_3$ and 99% He were set to 100 SCCM, 100 SCCM, and 300 SCCM, respectively, and the pressure in the reaction tube 3 was controlled to 0.2 Torr. The other conditions including heating temperature were identical to those in the above-described example. The resultant film had a phosphor density of $2.0 \times 10^{20}/cm^3$.

As is evident from this result, the polysilicon film produced by the conventional method has a phosphor density lower than that of the film produced by the method of the invention.

In the conventional method, even when the flow of the mixture containing 1% $PH_3$ was set at 300 SCCM, a desired phosphor density could be obtained. In this case, however, the pressure in the reaction tube 3 inevitably increased to 0.4–0.5 Torr, resulting in ununiform distribution of phosphor in the surface of the wafer.

In the invention, it is preferable to set the vacuum atmosphere in the reaction tube to about 0.1 Torr, which provides a thin film of a more uniform phosphor distribution.

In the step of forming the phosphor highly densified layer, the flow of the dope gas may be increased, or the supply of $SiH_6$ and $N_2$ may be not completely stopped, but reduced. Further, if such heat treatments as CVD, oxidation, and diffusion are carried out after a phosphor-doped film is formed, the annealing step may be omitted.

Moreover, the impurity is not limited to phosphor, and the main component is not limited to silicon. Also, the object on which a thin film is to be formed may be made of e.g. glass in stead of semiconductor. Films may be formed one by one in lieu of being subjected to a batch-type treatment.

Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept as defined by the appended claims and their equivalents.

What is claimed is:

1. A method of simultaneously forming semiconductor films on a plurality of substrates, comprising the steps of:

preparing a first treatment gas, the first treatment gas providing a main material of the semiconductor films as a result of thermal decomposition;

preparing a second treatment gas, the second treatment gas providing an impurity, with which the semiconductor films are doped, as a result of thermal decomposition;

heating a reaction tube;

loading the substrates into the reaction tube;

reducing pressure in the reaction tube;

supplying the reaction tube with the first and second treatment gases at first and second flow rates, respectively, thereby forming first layer on each of the substrates, the first layer containing the impurity of a first density;

supplying the reaction tube with the first and second treatment gases at third and fourth flow rates, respectively, thereby forming a second layer on the first layer, the second layer containing the impurity of a second density sufficiently higher than the first density;

supplying the reaction tube with the first and second treatment gases at fifth and sixth flow rates, respectively, thereby forming third layer on the second layer, the third layer containing the impurity of a third density sufficiently lower than the second density; and diffusing the impurity contained in the second layer into the first and third layers by heating the first through third layers, thereby making an integral film of uniform impurity density from the first through third layers.

2. The method according to claim 1, wherein the third flow rate is substantially 0.

3. The method according to claim 1, wherein the first flow rate is substantially identical to the fifth flow rate, and the second flow rate is substantially identical to the sixth flow rate.

4. The method according to claim 1, wherein the first treatment gas is $Si_2H_6$, and the second treatment gas is $PH_3$.

5. The method according to claim 4, wherein the reaction tube is heated up to about 500° C.

6. The method according to claim 5, wherein the pressure in the reaction tube is 0.2 Torr or less.

7. The method according to claim 1, wherein the second treatment gas is preheated before introduced into the reaction tube.

8. The method according to claim 5, wherein the second treatment gas is preheated up to 400° C. before introduced into the reaction tube.

9. The method according to claim 6, wherein $Si_2H_6$ and $PH_3$ are respectively diluted with inactive gases before introduced into the reaction tube.

10. A method of forming a semiconductor film on a substrate, comprising the steps of:

preparing a first treatment gas, the first treatment gas providing a main material of the semiconductor film as a result of thermal decomposition;

preparing a second treatment gas, the second treatment gas providing an impurity, with which the semiconductor film is doped, as a result of thermal decomposition;

heating a reaction tube;

loading the substrate into the reaction tube;

reducing pressure in the reaction tube;

supplying the reaction tube with the first and second treatment gases at first and second flow rates, respectively, thereby forming first layer on the substrate, the first layer containing the impurity of a first density;

supplying the reaction tube with the first and second treatment gases at third and fourth flow rates, respectively, thereby forming second layer on the first layer, the second layer containing the impurity of a second density sufficiently higher than the first density;

supplying the reaction tube with the first and second treatment gases at fifth and sixth flow rates, respectively, thereby forming third layer on the second layer, the third layer containing the impurity of a third density sufficiently lower than the second density; and diffusing the impurity contained in the second layer into the first and third layers by heating the first through third layers, thereby making an integral film of uniform impurity density from the first through third layers.

11. The method according to claim 10, wherein the third flow rate is substantially 0.

12. The method according to claim 10, wherein the first flow rate is substantially identical to the fifth flow rate, and the second flow rate is substantially identical to the sixth flow rate

* * * * *